(12) United States Patent
Howard et al.

(10) Patent No.: US 7,418,995 B2
(45) Date of Patent: Sep. 2, 2008

(54) SYSTEM FOR COOLING ENVIRONMENTALLY SEALED ENCLOSURES

(75) Inventors: Scott Douglas Howard, Hilliard, OH (US); Philip Warwick Irwin, Dublin, OH (US)

(73) Assignee: Vanner, Inc., Hilliard, OH (US)

( * ) Notice: Subject to any disclaimer, the term of this patent is extended or adjusted under 35 U.S.C. 154(b) by 680 days.

(21) Appl. No.: 11/035,574

(22) Filed: Jan. 14, 2005

(65) Prior Publication Data
US 2005/0150634 A1 Jul. 14, 2005

Related U.S. Application Data

(60) Provisional application No. 60/536,328, filed on Jan. 14, 2004.

(51) Int. Cl.
*H05K 7/20* (2006.01)
(52) U.S. Cl. .................. 165/80.3; 165/121; 361/697
(58) Field of Classification Search ............ 165/80.3, 165/122, 185; 361/688, 689; 454/184; 312/236
See application file for complete search history.

(56) References Cited

U.S. PATENT DOCUMENTS

| | | | | | |
|---|---|---|---|---|---|
| 3,961,666 | A | * | 6/1976 | Suzuki et al. ............. | 165/129 |
| 4,520,425 | A | * | 5/1985 | Ito .............................. | 361/697 |
| 4,699,208 | A | * | 10/1987 | Wolf et al. .................. | 165/47 |
| 4,858,069 | A | * | 8/1989 | Hughes ....................... | 361/696 |
| 5,422,787 | A | * | 6/1995 | Gourdine .................... | 361/697 |
| 5,748,445 | A | * | 5/1998 | North et al. ................. | 361/697 |
| 5,915,466 | A | * | 6/1999 | Aakalu et al. .............. | 165/121 |
| 6,038,129 | A | * | 3/2000 | Falaki et al. ................ | 361/699 |
| 6,459,577 | B1 | * | 10/2002 | Holmes et al. .............. | 361/690 |
| D499,074 | S | | 11/2004 | Cook et al. | |
| 6,940,716 | B1 | * | 9/2005 | Korinsky et al. ............ | 361/695 |
| 7,245,485 | B1 | * | 7/2007 | Morrell ....................... | 361/687 |
| 2002/0030981 | A1 | * | 3/2002 | Sullivan et al. ............. | 361/829 |

* cited by examiner

*Primary Examiner*—Allen J Flanigan
(74) *Attorney, Agent, or Firm*—James R. Eley; Michael A. Forham; Eley Law Firm Co.

(57) ABSTRACT

A system for cooling an environmentally sealed enclosure. The system includes an air channel extending generally vertically from a top surface of the enclosure to a bottom surface of the enclosure, at least one interior heat sink forming a barrier between the air channel and an interior portion of the enclosure, a fan disposed in the air channel and adapted to force air to flow through the air channel, and a plenum proximate the air channel to duct exhaust air away from the enclosure, wherein air flowing through the air channel cools the enclosure. A method employs the system.

16 Claims, 2 Drawing Sheets

SYSTEM FOR COOLING ENVIRONMENTALLY SEALED ENCLOSURES

This application claims priority to U.S. provisional application 60/536,328, filed Jan. 14, 2004, the contents of which are hereby incorporated by reference.

FIELD

The present invention relates generally to enclosures. In particular, the present invention relates to a system for cooling heat-generating components in an environmentally sealed enclosure.

BACKGROUND

A limitation of electronic equipment, such as power supplies and inverters, is inadequate cooling of their internal components. It is desirable to keep certain components such as power stages cool, so as not to exceed the rated temperature for the components and to permit higher output power ratings for the equipment. Forced convection cooling is preferred because moving air is highly effective in removing waste heat. However, with convection cooling there is a risk of contaminated air (such as gas byproducts of nearby batteries) being drawn into the equipment. The contaminated air can cause corrosion and degradation that can reduce the life of components and adversely affect the reliability of the equipment. In addition, heated waste air drawn from the equipment tends to heat other nearby equipment. Therefore it is desirable that there be adequate cooling of the components of electronic equipment and that it be done such that the waste air is disposed of without thermally affecting adjacent electronic equipment.

SUMMARY

The present invention provides a system for cooling heat-generating portions of electronic equipment. The present invention also minimizes the effects of contaminated air on equipment components. In addition, the present invention provides for disposal of waste air without substantially increasing the temperature of nearby equipment.

An aspect of the present invention is a system for cooling an environmentally sealed enclosure. The system includes an air channel extending generally vertically from a top surface of the enclosure to a bottom surface of the enclosure, at least one interior heat sink forming a barrier between the air channel and an interior portion of the enclosure, a fan disposed in the air channel and adapted to force air to flow through the air channel, and a plenum proximate the air channel to duct exhaust air away from the enclosure, wherein air flowing through the air channel cools the enclosure.

Another aspect of the present invention is a system for cooling an environmentally sealed enclosure. The system comprises an air channel extending generally vertically from a top surface of the enclosure to a bottom surface of the enclosure, at least one interior heat sink forming a barrier between the air channel and an interior portion of the enclosure, a fan disposed in the air channel and adapted to force air to flow through the air channel, an air inlet disposed in the bottom surface of the enclosure proximate the air channel, an air outlet disposed in the top surface of the enclosure proximate the air channel, a rear heat sink mounted to a rear portion of the enclosure, and a plenum proximate the air channel to duct exhaust air away from the enclosure. Air flows into the inlet, through the air channel, is exhausted through the outlet, and is directed over the rear heat sink by the plenum to cool the enclosure.

Yet another aspect of the present invention is a method for cooling an environmentally sealed enclosure. The method comprises the steps of routing an air channel generally vertically from a top surface of the enclosure to a bottom surface of the enclosure, installing at least one interior heat sink in the air channel to form a barrier between the air channel and an interior portion of the enclosure, forcing air to flow through the air channel, and ducting exhaust air away from the enclosure, wherein air flowing through the air channel cools the enclosure.

BRIEF DESCRIPTION OF THE DRAWINGS

Further features of the inventive embodiments will become apparent to those skilled in the art to which the embodiments relate from reading the specification and claims with reference to the accompanying drawings, in which:

DETAILED DESCRIPTION

A system for cooling electronic equipment according to an embodiment of the present invention is illustrated in FIGS. 1A-1D. The system comprises an enclosure 10 having a forced-air convection fan 12, a rear heatsink 14 and an exhaust plenum 16.

Figure 2:
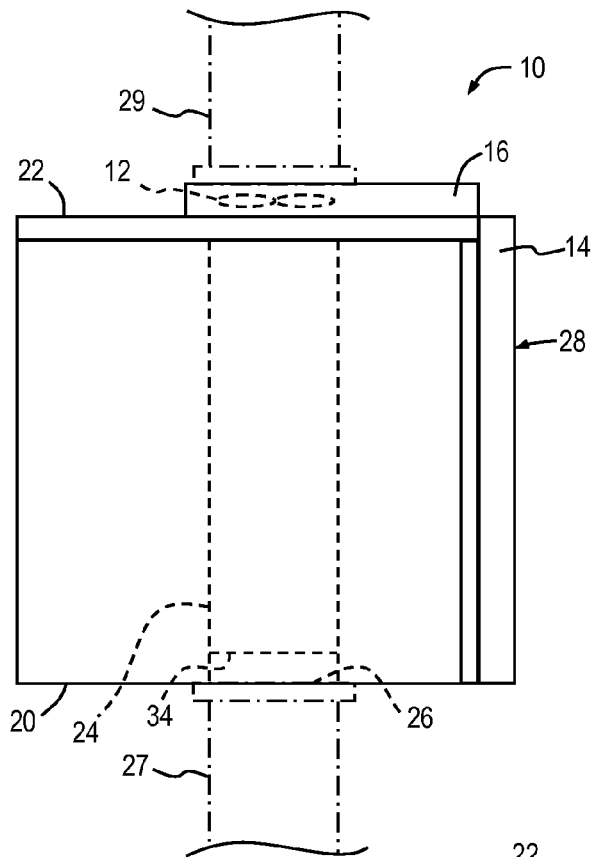
FIG. 2 is a diagram showing the general arrangement of an enclosure according to an embodiment of the present invention.

Enclosure 10 includes four internal heatsink 18A-18D extending generally vertically from a bottom portion 20 to a top portion 22 to form sidewalls of a heat "chimney" or air channel 24. Heatsinks 18A-18D are arranged such that cooling air is drawn into a bottom inlet 26 of enclosure 10 by a fan 12 located proximate top portion 22. The fan may be provided as a tube-axial or other suitable configuration. This arrangement is preferred for vehicle installations where the equipment is located in an existing housing arrangement such as a battery box (not shown), wherein inlet 26 is proximate a bottom portion 20 of enclosure 10 to minimize the introduction of contaminants such as acidic gas from batteries in the battery box. Bottom inlet 26 may optionally be coupled by ducting, such as a duct 27 (FIG. 2) to a source of uncontaminated air external to the battery box. Heatsinks 18A-18D form sidewalls of air channel 24 and act as a baffler to minimize the exposure of internal electronic components (not shown) of enclosure 10 to contaminated cooling air, since air flows only through air channel 24 and not around the electronic components. Enclosure 10 may be environmentally sealed in any conventional manner, such as sealants and gaskets, to minimize ingress of contaminants into the enclosure.

An external heatsink 14 is mounted to a rear portion 28 of enclosure 10 to act as an air-to-air heat exchanger, a plurality of fins of the heatsink providing a large exterior surface area to maximize cooling of electronic components attached to an interior portion of the heatsink. Heatsinks 14, 18A, 18B, 18C and 18D and mating components such as exhaust ducting 29 (FIG. 2) connected to plenum 16 may be finished in black to reduce the thermal resistance of the heatsink and ducting, which improves cooling performance of enclosure 10.

Figure 3:
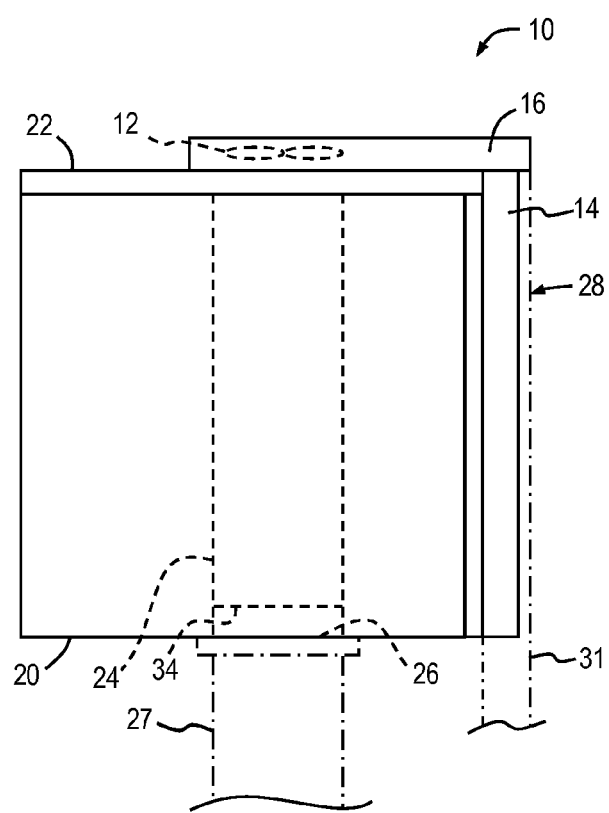
FIG. 3 is a diagram showing the general arrangement of an enclosure according to another embodiment of the present invention.

Further cooling of heatsink 14 may be accomplished by routing exhaust air 30 of air channel 24 over heatsink 14 with plenum 16. Exhaust air 30 is directed downwardly over heatsink 14, as shown best in FIGS. 1C and 1D. In addition, plenum 16 may optionally be connected to ducting, such as a duct 31 (FIG. 3) to exhaust air 30 away from enclosure 10 and other equipment near the enclosure.

Figure 1A:
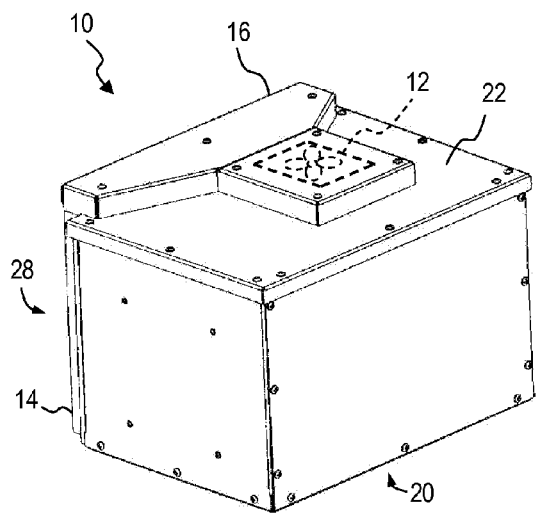
FIG. 1A is a perspective view of a front portion of an enclosure according to an embodiment of the present invention.
Figure 1B:
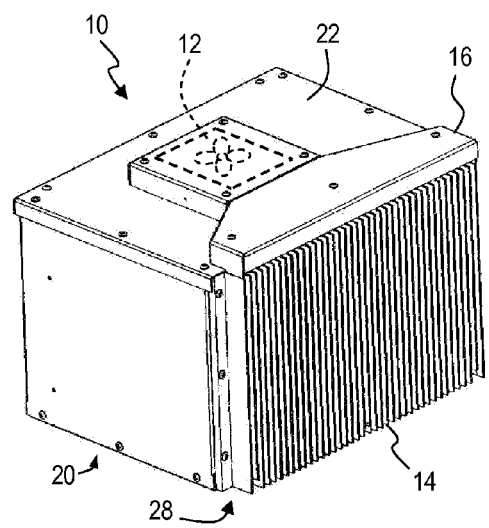
FIG. 1B is a perspective view of a rear portion of the enclosure of FIG. 1A showing a heat sink according to an embodiment of the present invention.
Figure 1C:
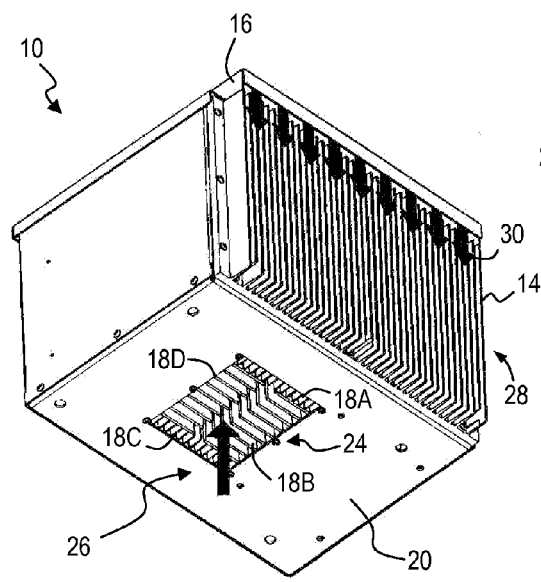
FIG. 1C is a perspective view of a bottom and rear portion of the enclosure of FIG. 1A according to an embodiment of the present invention.
Figure 1D:
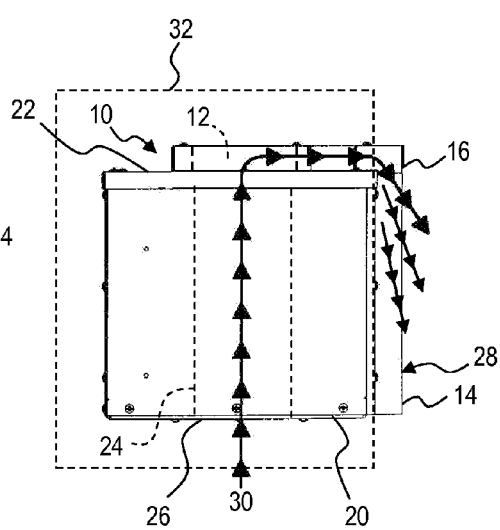
FIG. 1D is an elevational view of the enclosure of FIG. 1A showing air flow through the inverter and over the heat sink according to an embodiment of the present invention.

Exhaust air 30 of air channel 24 may be arranged such that the air is exhausted outside a compartment 32, such as a battery box, shown in FIG. 1D.

In operation, enclosure 10 is substantially environmentally sealed to minimize air ingress into the enclosure, except through air channel 24. Heat generated by electronic components internal to enclosure 10 is coupled to at least one of heat sinks 14, 18A, 18B, 18C and 18D in any conventional manner, such as by mounting the heat-generating components to one or more of the heat sinks. Air is forced through air channel 24 by fan 12, drawing air through an inlet 26 located at bottom portion 20 of enclosure 10. The moving air 30 draws heat away from heat sinks 18A, 18B, 18C and 18D and flows into plenum 16, where it is exhausted or ducted to the atmosphere. Exhaust air 30 may be ducted over rear heatsink 14 by plenum 16, aiding to remove heat from the rear heatsink.

In one embodiment of the present invention a conventional air filter 34 (FIGS. 2 and 3) may be disposed in air channel 24 to capture and retain contaminants present in the flowing air.

While this invention has been shown and described with respect to a detailed embodiment thereof, it will be understood by those skilled in the art that changes in form and detail thereof may be made without departing from the scope of the claims of the invention.

What is claimed is:

1. A system for cooling an environmentally sealed enclosure, comprising:
    an air channel extending between a first surface of the enclosure and a second, opposing surface of the enclosure;
    at least one interior heatsink forming a barrier between the air channel and an interior portion of the enclosure;
    an external heatsink mounted to the enclosure;
    a fan disposed in the air channel and adapted to force air to flow through the air channel; and
    a plenum proximate the air channel to duct exhaust air away from the enclosure, wherein air flowing through the air channel cools the enclosure.

2. The system of claim 1 wherein the plenum is adapted to direct the flowing air over the external heatsink.

3. The system of claim 1 wherein at least one of the interior heatsink and the external heatsink is black in color to increase heat radiation.

4. The system of claim 1 wherein the air channel comprises four sidewalls formed by four interior heatsinks.

5. The system of claim 1 wherein the fan is a tube-axial fan.

6. The system of claim 1 wherein the plenum is connected to ducting to exhaust the flowing air away from the enclosure.

7. The system of claim 1 wherein an air filter is disposed in the air channel to capture and retain contaminants in the flowing air.

8. The system of claim 1, further comprising:
    an air inlet disposed in the second surface of the enclosure proximate the air channel; and
    an air outlet disposed in the first surface of the enclosure proximate the air channel,
    wherein air flows into the inlet, through the air channel, and is exhausted through the outlet and the plenum to cool the enclosure.

9. A system for cooling an environmentally sealed enclosure, comprising:
    an air channel extending generally vertically from a top surface of the enclosure to a bottom surface of the enclosure;
    at least one interior heatsink forming a barrier between the air channel and an interior portion of the enclosure;
    a fan disposed in the air channel and adapted to force air to flow through the air channel;
    an air inlet disposed in the bottom surface of the enclosure proximate the air channel;
    an air outlet disposed in the top surface of the enclosure proximate the air channel;
    a rear heatsink mounted to a rear portion of the enclosure; and
    a plenum proximate the air channel to duct exhaust air away from the enclosure,
    wherein air flows into the inlet, through the air channel, is exhausted through the outlet, and is directed over the rear heatsink by the plenum to cool the enclosure.

10. The system of claim 9 wherein at least one of the interior heatsink and the rear heatsink is black in color to increase heat radiation.

11. The system of claim 9 wherein the air channel comprises four sidewalls formed by four interior heatsinks.

12. The system of claim 9 wherein the fan is a tube-axial fan.

13. The system of claim 9 wherein the plenum is connected to ducting to exhaust the flowing air away from the enclosure.

14. The system of claim 9 wherein an air filter is disposed in the air channel to capture and retain contaminants in the flowing air.

15. A method for cooling an environmentally sealed enclosure, comprising the steps of:
    routing an air between a first surface of the enclosure and a second, opposing surface of the enclosure;
    installing at least one interior heatsink in the air channel to form a barrier between the air channel and an interior port ion of the enclosure;
    mounting a heatsink to an external portion of the enclosure;
    forcing air to flow through the air channel; and
    ducting exhaust air away from the enclosure, wherein air flowing through the air channel cools the enclosure.

16. The method of claim 15, further comprising the step of directing flowing air over the externally-mounted heatsink.

* * * * *

UNITED STATES PATENT AND TRADEMARK OFFICE
CERTIFICATE OF CORRECTION

| | |
|---|---|
| PATENT NO. | : 7,418,995 B2 |
| APPLICATION NO. | : 11/035574 |
| DATED | : September 2, 2008 |
| INVENTOR(S) | : Scott Douglas Howard and Philip Warwick Irwin |

Page 1 of 1

It is certified that error appears in the above-identified patent and that said Letters Patent is hereby corrected as shown below:

On the title page, in section (74), "Michael A. Forham" should be --Michael A. Forhan--.

Column 2, line 48, replace "heatsink" with --heatsinks--; line 63, replace "baffler" with --barrier--.

Signed and Sealed this

Eleventh Day of November, 2008

JON W. DUDAS
*Director of the United States Patent and Trademark Office*